(12) United States Patent
Spallas et al.

(10) Patent No.: US 7,045,794 B1
(45) Date of Patent: May 16, 2006

(54) STACKED LENS STRUCTURE AND METHOD OF USE THEREOF FOR PREVENTING ELECTRICAL BREAKDOWN

(75) Inventors: James Spallas, Alamo, CA (US); Lawrence Muray, Moraga, CA (US)

(73) Assignee: Novelx, Inc., Lafayette, CA (US)

( * ) Notice: Subject to any disclaimer, the term of this patent is extended or adjusted under 35 U.S.C. 154(b) by 0 days.

(21) Appl. No.: 10/908,397

(22) Filed: May 10, 2005

Related U.S. Application Data

(60) Provisional application No. 60/581,130, filed on Jun. 18, 2004, provisional application No. 60/581,083, filed on Jun. 18, 2004.

(51) Int. Cl.
*H01J 37/26* (2006.01)

(52) U.S. Cl. .................................. 250/396 R
(58) Field of Classification Search ............ 250/396 R, 250/310, 492.2
See application file for complete search history.

(56) References Cited

U.S. PATENT DOCUMENTS

| 4,200,794 | A | * | 4/1980 | Newberry et al. ... 250/396 ML |
| 5,122,663 | A | | 6/1992 | Chang et al. |
| 5,155,412 | A | | 10/1992 | Chang et al. |
| 6,288,401 | B1 | | 9/2001 | Chang et al. |
| 6,946,662 | B1 | * | 9/2005 | Ono et al. ............... 250/396 R |
| 6,956,219 | B1 | * | 10/2005 | Saini et al. ................. 250/398 |

OTHER PUBLICATIONS

L.P. Muray et al., "Advances in Arrayed Microcolumn Lithography," *J. Vac. Sci. Technol. B*, Nov./Dec. 2000, pp. 3099-3104, vol. 18, No. 6, American Vacuum Society, New York, U.S.A.

T.H.P. Chang et al., "Multiple Electron-Beam Lithography," *Microelectronic Engineering*, 2001, pp. 117-135, vol. 57-58.

* cited by examiner

*Primary Examiner*—Kiet T. Nguyen
(74) *Attorney, Agent, or Firm*—Squire, Sanders & Dempsey L.L.P.; Aaron Wininger

(57) ABSTRACT

A micro-electrical system, such as a lens stack for use in a scanning electron microscope, analysis tool, etc., comprises recesses and/or serrations that increase the surface path breakdown, thereby increasing reliability and enabling high voltage operations.

29 Claims, 8 Drawing Sheets

STACKED LENS STRUCTURE AND METHOD OF USE THEREOF FOR PREVENTING ELECTRICAL BREAKDOWN

PRIORITY REFERENCE TO PRIOR APPLICATIONS

This application claims benefit of and incorporates by reference U.S. patent application Ser. No. 60/581,130, entitled "Sculpted Insulators For Preventing Electrical Breakdown Along The Sidewalls Of Stacked Lens Structures," filed on Jun. 18, 2004, by inventors James P. Spallas, et al. This application also claims benefit of and incorporates by reference U.S. patent application Ser. No. 60/581,083, entitled "Method For Preventing Electrical Breakdown Along The Sidewalls Of Stacked Lens Structures," filed on Jun. 18, 2004, by inventors James P. Spallas, et al.

GOVERNMENT LICENSE RIGHTS

The invention was made with Government support under DAAH01-03-C-R257 issued by the US Army Aviation & Missile Command. The Government has certain rights in the invention.

TECHNICAL FIELD

This invention relates generally to electron beam columns, and more particularly, but not exclusively, provides a micro-electrical component, such as a stacked lens structure, and method for preventing electrical breakdown for use in an electron beam column package that can be used in scanning electron microscopes, lithography tools, inspection, and other applications.

BACKGROUND

Electron beam columns are used in scanning electron microscopes (SEMs) that image objects and in lithography tools for writing patterns onto semiconductor materials to be used as integrated circuits. Conventional electron beam columns consist of an assembly of components, including lenses, magnets, deflectors, blankers, etc., individually machined out of stainless steel or other alloys and individually assembled, and an electron source.

Alternatively, miniature electron beam columns can be made by using, in part, micro-fabricated lenses, deflectors and blankers. These elements are fabricated in silicon using micro-electromechanical systems (MEMS) fabrication technologies and assembled into components. Each component consists of vertically stacked silicon lenses that are electrically isolated by dielectric spacers, like, for example, glass. The silicon and glass elements have at least one aperture concentric with very other aperture creating a path for the electron beam to transverse. The components are energized to focus, blank, and steer the electron beam.

The maximum beam energy of these miniature columns is determined by electrical breakdown which typically occurs across the exposed surfaces located in the apertures and at the edges of the components. The breakdown potential across these surfaces is lower than predicted based on the thicknesses and material properties of the dielectrics for many reasons including surface contamination, roughness, topography, or ambient conditions like humidity, gas composition, and pressure. The reduced breakdown potential of these components caused by surface breakdown effects limits the ability to operate at high voltages, as needed for analysis tools, and limits reliability at low voltages, as needed in scanning electron microscopes, lithography tools, and other applications.

MEMS and other micro-devices are especially susceptible to surface breakdown. Electric fields can be very large as a result of the small distances (e.g., 0.1–1000 um). The sidewalls are often created by sawing or laser cutting. These processes create rough sidewall surfaces and can cause smearing which can further reduce the breakdown path length. An additional failure is contamination creep whereby contaminants, such as hydrocarbons, are charged and "creep" along the surfaces creating short paths. Creep is also mitigated by increasing the surface paths lengths. Sculpting the insulating sidewalls to increase the breakdown path is not possible with conventional technology because the surfaces are typically less than 500 um long.

Accordingly, a component and method of use thereof is needed with a breakdown potential equal to and preferably greater than the predicted values base based on the bulk material properties. This minimizes column failures due to contamination, ambient, or process induced breakdown events. Accordingly, the column incorporating the component would be able to operate at higher voltages and with improved reliability at lower voltages.

SUMMARY

Embodiments of the invention provide a lens stack and method of use thereof with increased breakdown potential, thereby increasing reliability and enabling high voltage operation.

In one embodiment of the invention, an electron beam column lens stack is provided that comprises conductive layers and insulating layers between the conductive layers. Recessions are made to increase the breakdown path at the surfaces where breakdown is likely to occur. In a second embodiment of the invention, serrations are formed in the recessions to further increase the surface breakdown path and extend outward from the at least one aperture. In a third embodiment of this invention, the silicon lenses are formed with cutouts and oriented to each other to cause the surface breakdown path to be increased.

In an embodiment of the invention, a method of using the electron beam column includes generating an electron beam; focusing the beam with an electron beam column incorporating the lens stack; and scanning the beam over a target.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
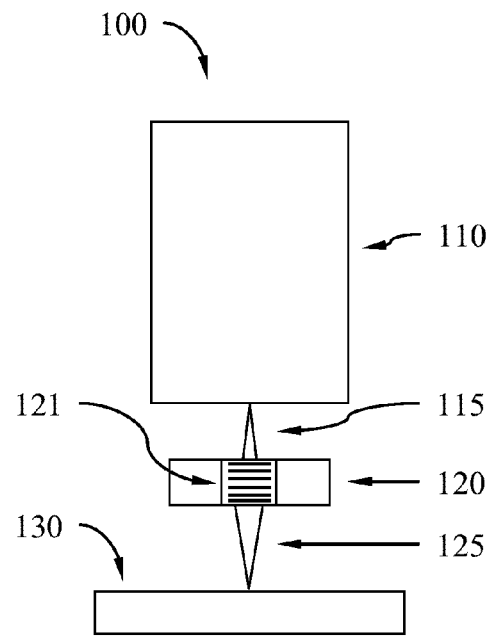
FIG. 1 is a block diagram illustrating an apparatus incorporating an electron beam column having a stacked component according to an embodiment of the invention.

FIG. 1 is a block diagram illustrating an apparatus 100 incorporating an electron beam column package 120. In embodiments of the invention, the apparatus 100 includes scanning electron microscopes, lithography, inspection, and analysis tools. The apparatus 100 includes an electron source 110 (cathode), such as an thermal field emitter (TFE), positioned adjacent to a beam column package 120, which supports the lenses, deflectors, blankers, magnetic or electrostatic, and other elements required for the column operation (heretofore components) 121. The package 120 and components 121 form the package assembly which is positioned adjacent to a sample holder 130. In an embodiment of the invention, the electron source 110 is positioned above the beam column package 120 and the sample holder 130 is positioned below the beam column package 120.

In an embodiment of the invention, the electron source 110 emits electrons 115 by field assisted thermionic emission. The electron source 110 can also comprise a Tungsten or LaB$_6$ filament, or any of a multitude of cold field emitters, including carbon nanotubes and microfabricated field emission tips. The electrons 115 can have an energy ranging from a few hundred eV to up to about 5 keV. The components 121 coupled to the beam column package 120, which will be discussed in further detail below, extract, collimate, and focus the electrons 115 into an electron beam 125, which is emitted from the package assembly as an electron beam 125. The package assembly scans the focused the beam 125 over the sample holder 130.

In an embodiment in which the apparatus 100 includes a scanning electron microscope, the sample holder 130 holds an object for viewing. The electron beam 125 strikes the object causing the emission of electrons which are detected by a detector (not shown), such as a micro-channel plate (MCP), mounted, in one embodiment, to a mounting plate (not shown) attached to the bottom of the beam column package 120. In an embodiment of the invention, an Everhart-Thornley detector can be used in addition to or in place of the MCP device in order to detect back-scattered and secondary electrons. The detected electrons are then used to generate an image of the object. In an embodiment of the invention, a silicon drift detector (SDD) or other photon detector can be used in addition to or in place of the MCP device in order to detect photons. The detected photons are then used for materials identification and analysis.

In an embodiment in which the apparatus 100 includes a lithography tool, the sample holder 130 holds a wafer onto which patterns for integrated circuits are written by the apparatus 100. The apparatus 100 includes a blanker to blank emission of electrons when necessary to generate the correct pattern on the wafer.

Figure 2:
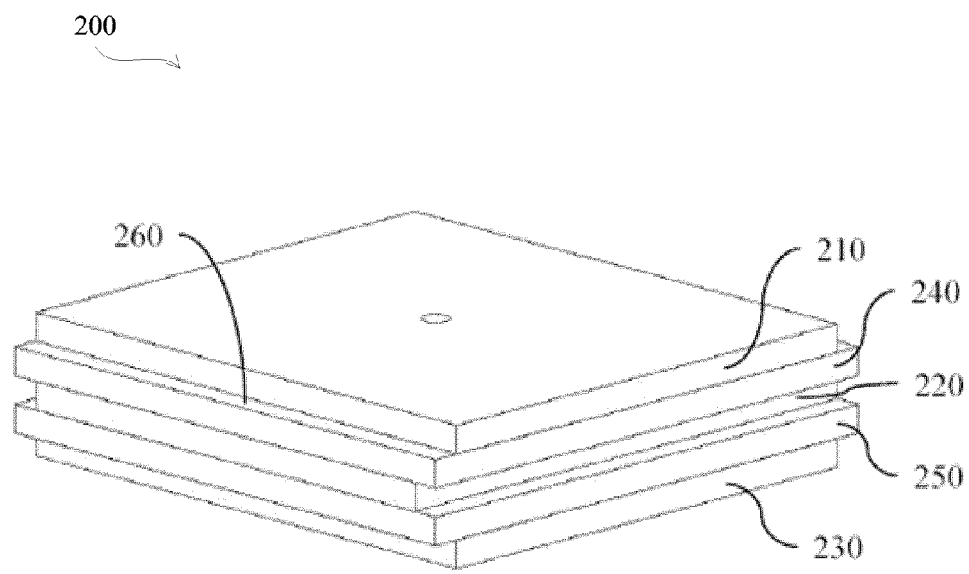
FIG. 2 is a perspective view illustrating the stacked component.

FIG. 2 is a perspective view illustrating a stacked component 200 of the components 121. The stacked component 200, and the other embodiments described herein, increase the surface breakdown of a micro-electrical system so that the probable breakdown path is through an insulator and therefore predictable and well understood. This is achieved, for example, by creating recesses or serrations in the insulators or conductors. The recesses and serrations are sculpted into the top and, optionally, the bottom of the insulator. The recesses and serrations increase the surface path length between conductors and therefore increase the voltage needed to cause breakdown along the surface. Accordingly, the system can operate at higher voltages and with more reliability at lower voltages as compared to other miniature electron beam columns.

The component 200, e.g., a stacked lens, comprises a plurality of conductive layers 210, 220, and 230 with an insulating layer 240 between the conductive layers 210 and 220 and an insulating layer 250 between the conductive layers 220 and 230. The conductive layers 210, 220, and 230 can be made of silicon and are shaped using a suitable MEMS fabrication process like, for example, deep reactive ion etching (DRIE). The insulators 240 and 250 are made of glass, for example, Pyrex, and are shaped using a process including thermal compression molding or ultrasonic drilling. In an embodiment of the invention, the layers 210–250 can each be about 200 to about 800 um thick, have areas of about 2×2 mm to about 15×15 mm, and have apertures with diameters of about 1 to about 4000 um.

The conductive layers 210, 220, and 230 are positioned so that they are recessed from the component edges. The conductive layers 210, 220, are 230 are designed so that when properly oriented and mated to the insulating layers 240 and 250, recesses at two edges of the component 200 are formed at each conductive layer 210, 220, and 230, thereby increasing the minimum surface breakdown path at the edge of the component 200 by the recess length, which can be any dimension that is practical (e.g., from a fraction of the thickness to several times the thickness of the components). The surface breakdown path between the conductor 210 and the conductor 220 at the edge of insulator 240, for example, is increased by the length of a recess 260. The benefit of this configuration is component 200 is mechanically stronger and less susceptible to breakage of thin cantilevered layers since no single layer is cantilevered.

Figure 3:
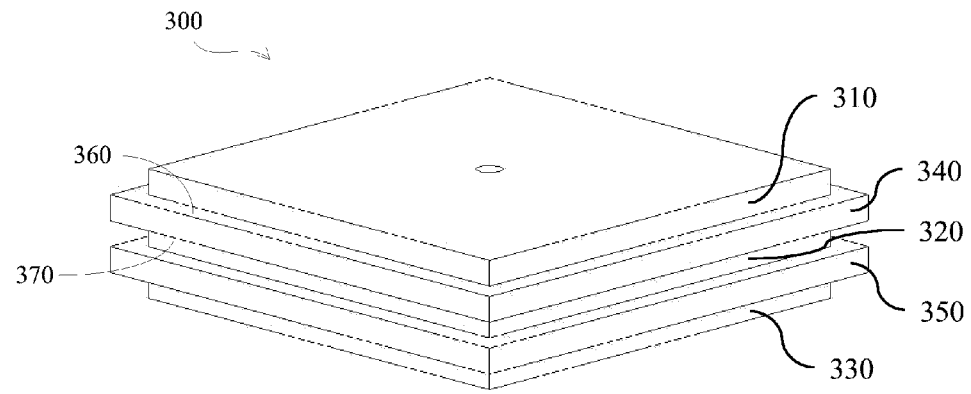
FIG. 3 is a perspective view illustrating a stacked component according to another embodiment of the invention.

FIG. 3 is a perspective view illustrating a stacked component 300 according to another embodiment of the invention. The component 300, e.g., a stacked lens, comprises a plurality of conductive layers 310, 320, and 330 with an insulating layer 340 between the conductive layers 310 and 320 and an insulating layer 350 between the conductive layers 320 and 330. In this embodiment, the conductors 310, 320, and 330 are recessed from each insulator 340 and 350 at every edge. The minimum surface breakdown path between two conductors across a common insulator at any edge of component 300 is increased by the recess length of each conductor. The surface breakdown path between conductor 310 and conductor 320 at the edge insulator 340, for example, is increased by the length of the recess 360 and 370. In the case where the recesses at the edges are equal to the insulator thickness, the breakdown path at the edges is increased by three times.

Figure 4:
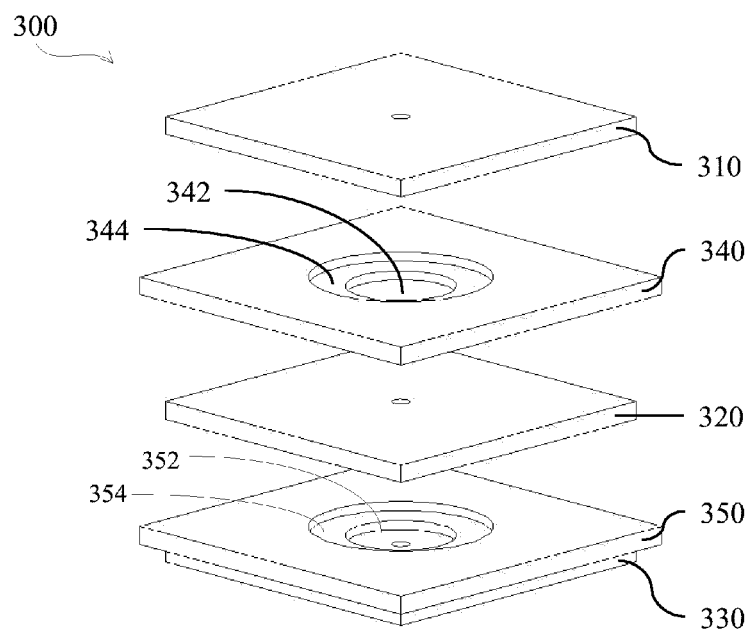
FIG. 4 is a diagram illustrating an exploded view of the component of FIG. 3.

FIG. 4 is a diagram illustrating an exploded view of the component 300 highlighting internal features of the component 300. The conductive layers 310, 320 and 330 each have circular apertures centered within the layers that enable an electron or ion beam to pass through. In an embodiment of the invention, the apertures for all the necessary elements can range from about 1 to about 4000 um. The insulators 340 and 350 also have circular apertures 342 and 352 centered within their layers that are larger than the apertures of the conductive layers 310–330. In an embodiment of the invention, the apertures 342 and 352 can range from about 1 to about 6 mm in diameter or greater, e.g., about 3 mm with about a 5 mm diameter recess. It will be appreciated by one of ordinary skill in the art that any of the apertures can have other shapes besides circles.

The surface breakdown paths at the apertures 342 and 352 in the insulators 340 and 350, respectively, are increased by forming recesses 344 and 354, respectively, in the insulators. The depth of the recess 344 and 354 can be, for example, about ½ of the thickness of the glass. In this embodiment, the surface breakdown path between any two conductors across a common insulator at the aperture is increased by the recess length. The surface breakdown path between conductor 310 and conductor 320 at the aperture 342 in insulator 340, for example, is increased by the length of the recess 344. In the case where the recess at the aperture is equal to twice the insulator thickness, the breakdown path at the aperture is increased by three times.

Figure 5:
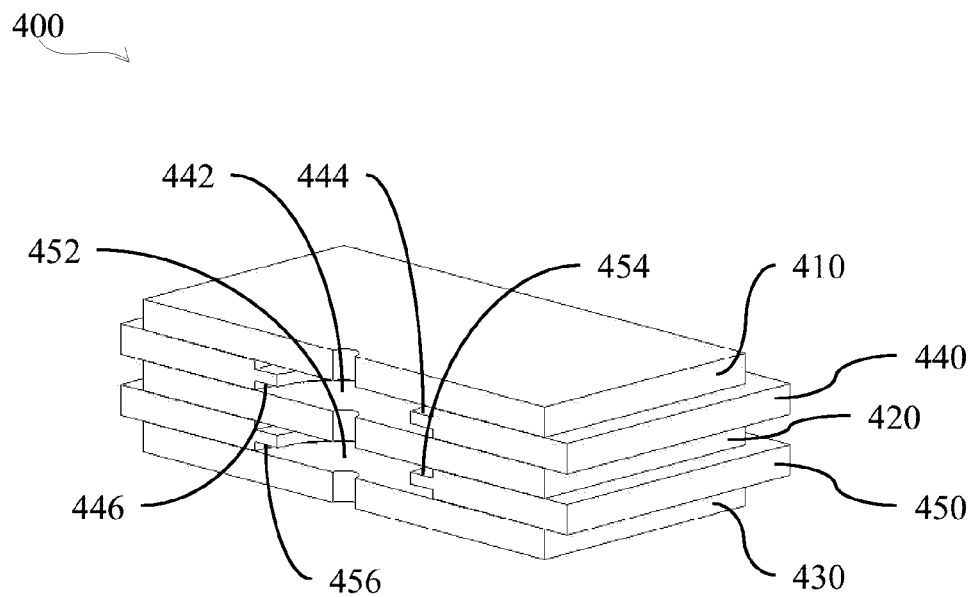
FIG. 5 is a perspective view of a cross section of a stacked component according to another embodiment of the invention.

FIG. 5 is a perspective view of a cross section of a stack component 400 according to another embodiment of the invention. The component 400, e.g., a stacked lens, comprises a plurality of conductive layers 410, 420, and 430 with an insulating layer 440 between the conductive layers 410 and 420 and an insulating layer 450 between the conductive layers 420 and 430. The conductive layers 410, 420 and 430 each have circular apertures centered within the layers that enable an electron or ion beam to pass through. The insulators 440 and 450 also have circular apertures 442 and 452 centered within their layers that are larger than the apertures of the conductive layers 410–430.

In this embodiment, recesses are made on both the top and bottom of the insulators 440 and 450. The surface breakdown paths between conductive layers at the apertures 442 and 452 are increased by recess lengths 444, 446 and 454, 456, respectively. The surface breakdown path between conductor 410 and conductor 440 at the aperture 442 in the insulator 440, for example, is increased by the length of the recess 444 and 446. In the case where the recess lengths on both sides of the insulator are equal to twice the insulator thickness, the breakdown path at each between conductive layers at a common aperture is increased by five times.

Figure 6:
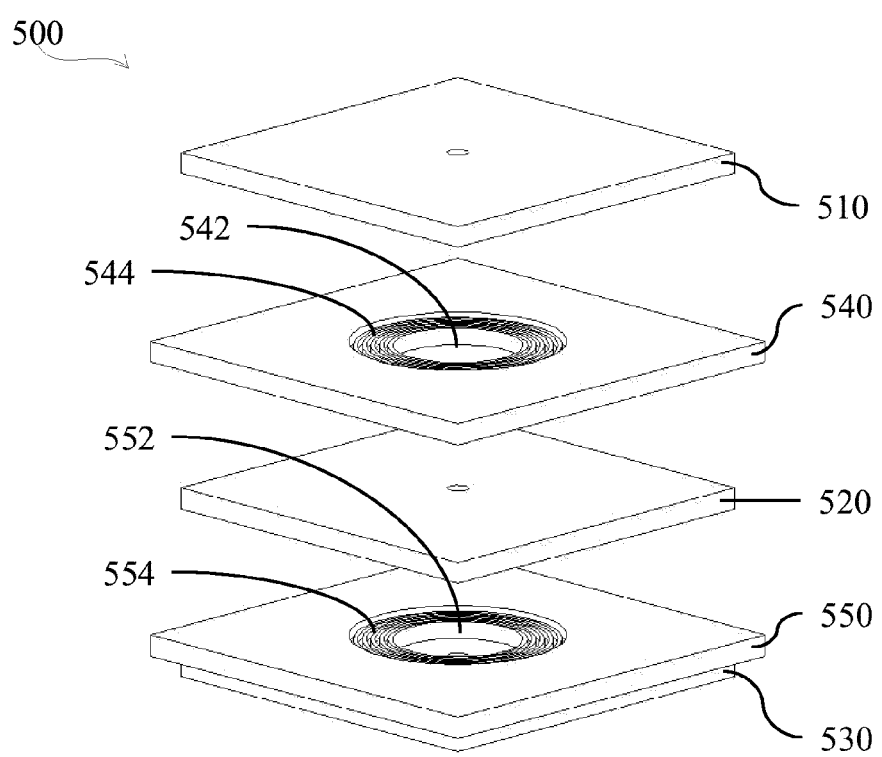
FIG. 6 is an exploded perspective view illustrating a stacked component according to another embodiment of the invention.

FIG. 6 is an exploded perspective view illustrating a stack component 500 according to another embodiment of the invention. The component 500, e.g., a stacked lens, comprises a plurality of conductive layers 510, 520, and 530 with an insulating layer 540 between the conductive layers 510 and 520 and an insulating layer 550 between the conductive layers 520 and 530. The conductive layers 510, 520 and 530 each have circular apertures centered within the layers that enable an electron or ion beam to pass through. The insulators 540 and 550 also have circular apertures 542 and 552 centered within their layers that are larger than the apertures of the conductive layers 510–530. Like the embodiments discussed above, the layers 510–550 can be mounted with respect to each other to form recesses at their exterior surfaces.

In this embodiment the edge surface breakdown paths at the apertures 542 and 552 in the insulators 540 and 550 have been increased by forming serrations 544 and 554 extending radially outward from the apertures 542 and 552, respectively. These serrations are shown formed in one side of the insulator, but may also be formed on both sides.

Figure 7:
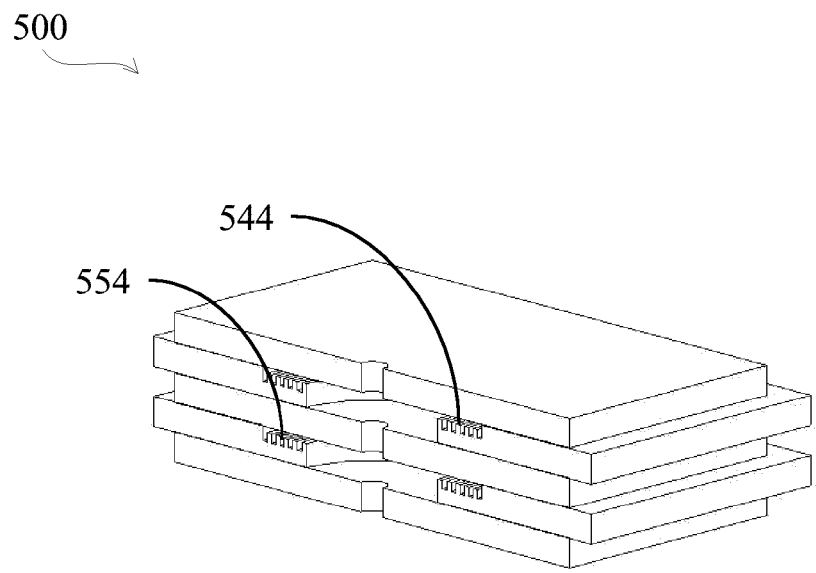
FIG. 7 is a perspective view illustrating a cross section of the stacked component of FIG. 6.

FIG. 7 is a perspective view illustrating a cross section of the stack component 500 (FIG. 6). The serrations 544 and 554 in this embodiment are rectangular and are recessed from the surface of the insulator to create a gap between the conductor and the top surface of the serrated region. The height, width, pitch and other dimensions of the serrations can be made as desired and are only restricted by the ability to reproduce them in the insulator. In an embodiment of the invention, the serrations 544 and 554 can have a thickness of about 500 um, a height of about 150 um, a width of about 100 um, and a pitch of about 200 um. The surface breakdown path between the conductor 510 and the conductor 520 at the aperture 542 in the insulator 540, for example, is increased by the pitch of the serrations plus twice the height of each serration multiplied by the number of serrations. In the case where the serrations are rectangular having heights and widths equal to $3/10$ and $1/5$ of the insulator thickness, respectively, and the number of serrations equal to 5, and having a constant pitch equal to twice the width, the breakdown path at the apertures is increased by five times.

Figure 8:
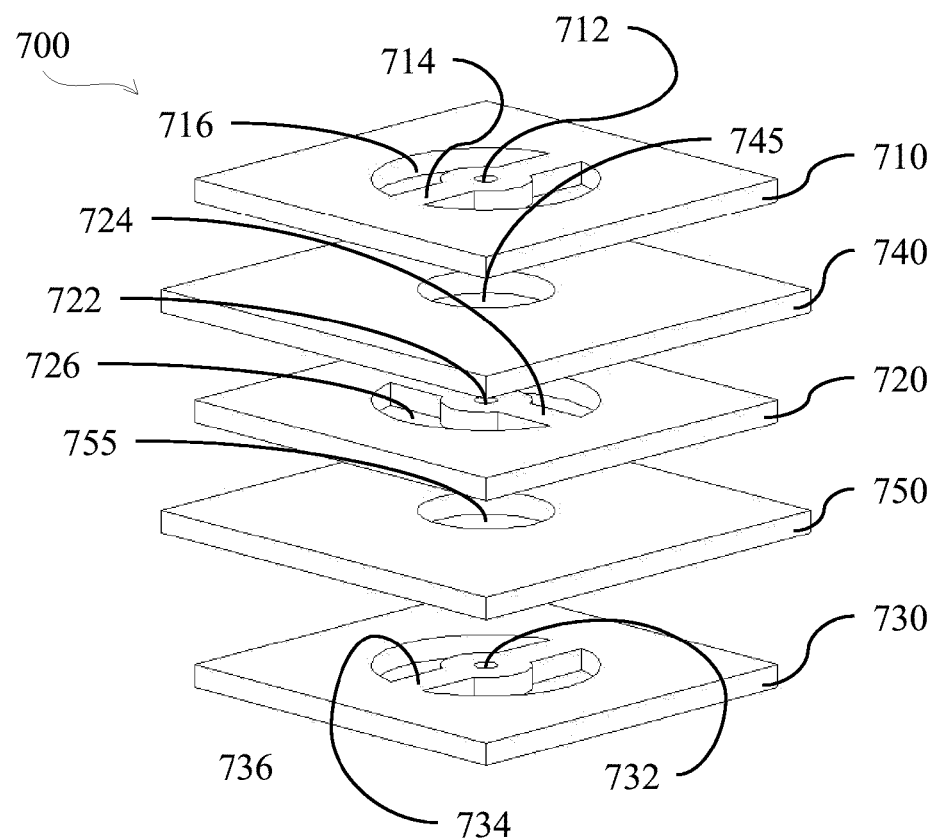
FIG. 8 is an exploded perspective view illustrating a stacked component according to another embodiment of the invention.

FIG. 8 is an exploded perspective view illustrating a stacked component 700 according to another embodiment of the invention. The component 700 comprises three conductive layers 710, 720, and 730 and two insulating layers 740 and 750 interspersed between the conductive layers 710, 720 and 730. The conductive layers 710, 720, and 730 have been recessed at the edges of the component 700 to increase the surface breakdown paths. In this embodiment the conductive layers 710, 720, and 730 have been micro-machined using, for example, DRIE processes and oriented to increase the surface breakdown path lengths between any two conducting layers across a common insulator. To this end, apertures 712, 722, and 732 are formed in air-bridges 714, 724, and 734 that span cutouts 716, 726, and 736 in the interiors of the conductors 710, 720, and 730 causing them to be suspended over apertures 745 and 755 in the insulating layers 740 and 750.

The shortest breakdown path in the embodiment shown in FIG. 8 is between the bridge 714 in the conductive layer 710 and the conductive layer 720 and between the bridge 734 in the conductive layer 730 and the conductive layer 720.

Figure 9:
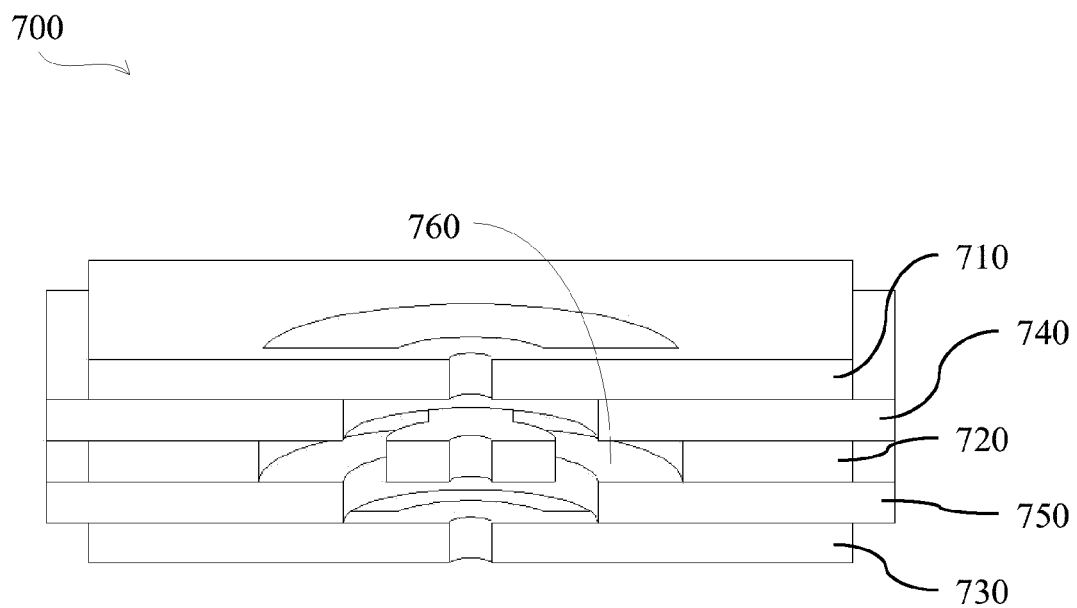
FIG. 9 is a perspective view illustrating a cross section of the stacked component of FIG. 8.
Figure 10:
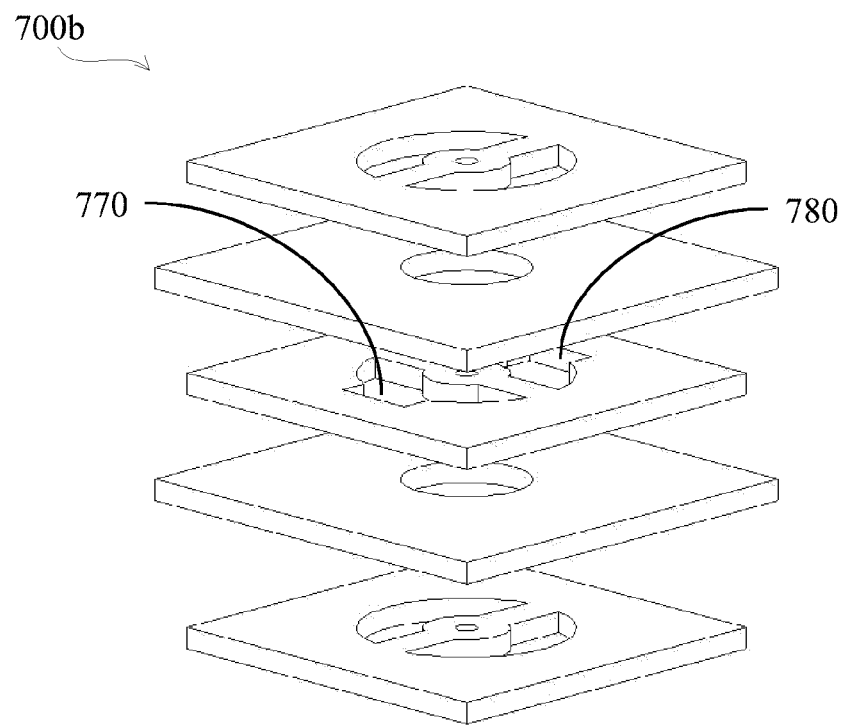
FIG. 10 is an exploded perspective view illustrating a stacked component according to another embodiment of the invention.

FIG. 9 is a perspective view illustrating a cross section of the stacked component 700 of FIG. 8. In the case where a recess 760 formed by the cutout 726 in conductor 720 is twice the thickness of insulator 750, then the shortest breakdown path between conductor 720 and conductor 730 is increased by three times. The cutouts 716, 726, and 736 can be made as large as needed provided the component area is sufficiently large. Additionally, the surface breakdown paths between the conductors 710 and 720 across the insulator 740 and between the conductors 720 and 730 across the insulator 750 can be increased by adding cutouts 770 and 780 as shown in FIG. 10. A good design will ensure that all surface path lengths are made sufficiently long so that surface breakdown will not occur at the surfaces and will probably occur through the insulators. A proper design will ensure that the diameters of the apertures 745 and 750 and the widths of the bridges 714, 724, and 734 (e.g., about 1 mm wide) are chosen so that the shortest break down path is not from bridge to bridge, like, for example, from the bridge 716 to the bridge 726.

Figure 11:
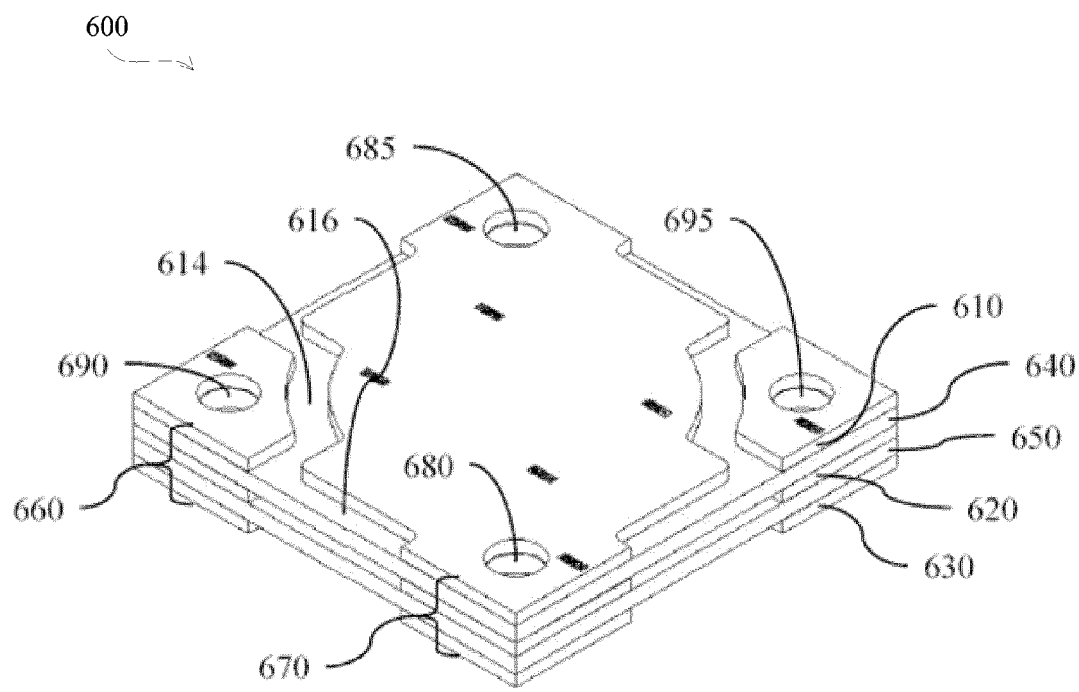
FIG. 11 is a perspective view illustrating a lens stack according to an embodiment of the invention.

FIG. 11 is a perspective view illustrating a lens stack 600 according to an embodiment of the invention. The lens stack 600 uses several of the technologies described above for making electrical connections between conductors separated, for example, by insulators. The lens stack 600 comprises three conductive layers 610, 620, and 630 and two insulating layers 640 and 650 therebetween. The conducting layers 610, 620, 630 are electrically isolated from each other by the insulators 640 and 650.

Figure 12A:
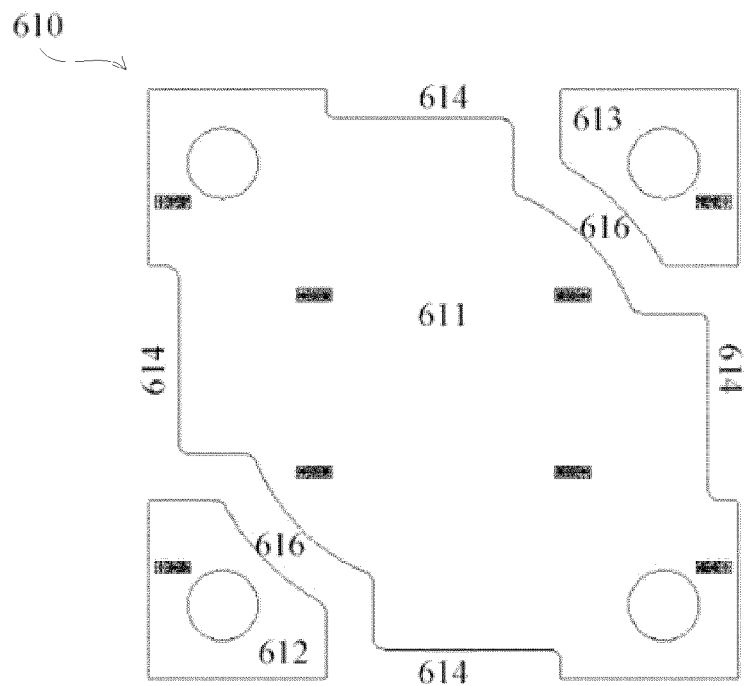
FIG. 12A–FIG. 12C are plan views illustrating separate layers of the lens stack.
Figure 12B:
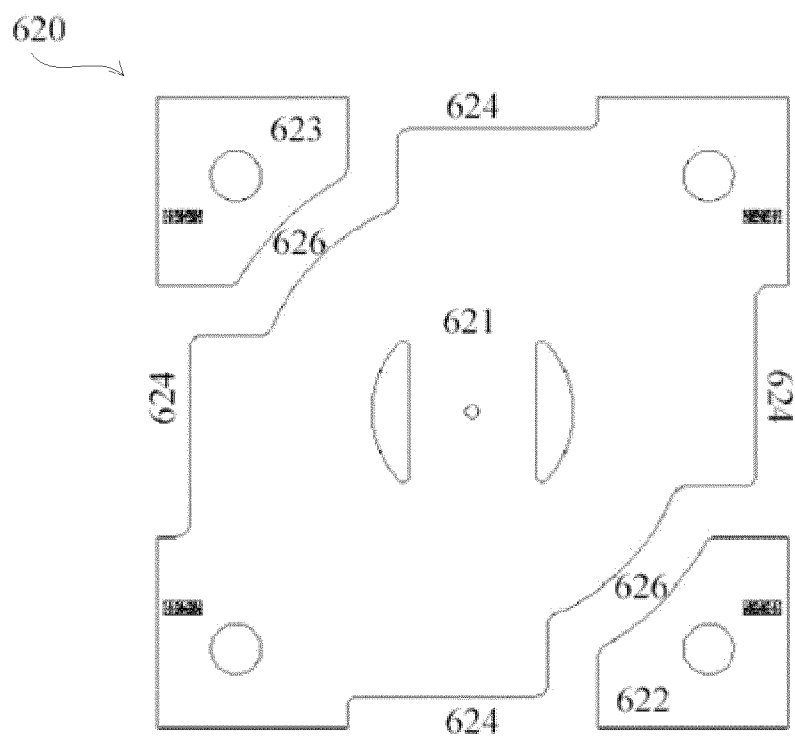
Figure 12C:
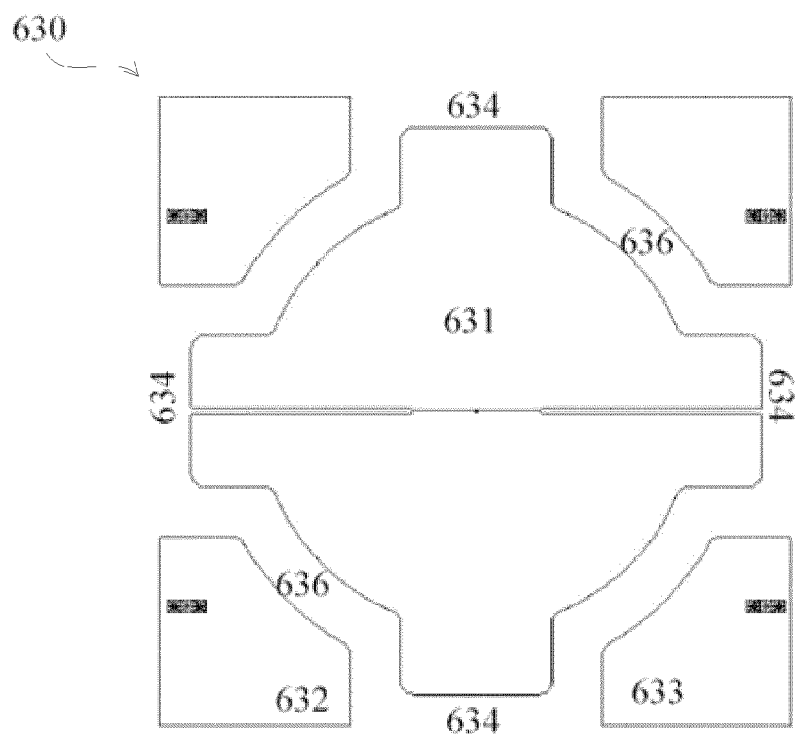

FIG. 12A–FIG. 12C are plan views illustrating separate layers of the lens stack 600, specifically, the conductive layers 610, 620, and 630, respectively. Each conductive layer has a lens 611, 621, and 631, respectively. Each conductive layer also has electrically isolated conductive regions 612, 613, 622, 623, 632, and 633 located at corners of the layers. Electrical isolation is achieved by creating recesses 614, 624, and 634 and trenches 616, 626, and 636 located at the edges of the conductive layers, using, for example, DRIE processes in the conductive layers. Conductive and insulating layers are coincident at the four corners of lens stack 600. For example, the conductors coincident with a sidewall region 660 are lens 621 and isolated regions 612 and 632. The conductors coincident with a sidewall region 670 are lens 611 and isolated regions 622 and 633. The surface breakdown paths across a common insulator between any two lenses at the edges of the lens stack 600 are equal to the sum of the length of the recesses 614 and 624 or 624 and 634 plus the insulator thickness. The breakdown paths of the lens stack 600 between the lens 611, 621, and 631 away from the edges are the trench lengths 616, 626, and 636. The surface breakdown paths across a common insulator between any two lenses at the apertures of the lens stack 600 are equal to the length of the recesses at the aperture (not shown) plus the insulator thickness.

To enable commonly used attach methods like, for example, bump ball bonding, electrical contact to the lenses 611, 621, and 631 must be made at a common layer like, for example, the layer 630. In one embodiment, the lens 611 is connected to the region 632 in the conductive layer 630 by metallizing the sidewalls 670. Similarly, the lens 621 is connected to the region 633 in the conductive layer 630 by metallizing the sidewall 660.

In another embodiment, the lens 611 is connected to the region 632 in the conductive layer 630 by using vias 680 and 685 that comprise concentric apertures in lens 611, the insulators, and the isolated regions 622 and 623, and lens 621 is connected to the region 633 in the conductive layer 630 using the vias 690 and 695 that comprise concentric apertures in lens 621, the insulators, and the isolated region 612 and 613. Electrical contact is made by filling the vias 680, 685, 690, and 695 with a conductive material like, for example, epoxy, or by a conductor that is re-flowed like, for example, solder.

In an embodiment of the invention, the holes in the conductors and insulators can be made increasingly smaller from top to bottom so that each layer is exposed (not shown). This achieves two purposes: (1) all conductors are exposed when the process used to make electrical connection is performed ensuring that each is made common with the appropriate other component, and (2) it prevents the formation of cavities that can trap gas and create a virtual leak in the case where the structure is operated in a vacuum.

Figure 13:
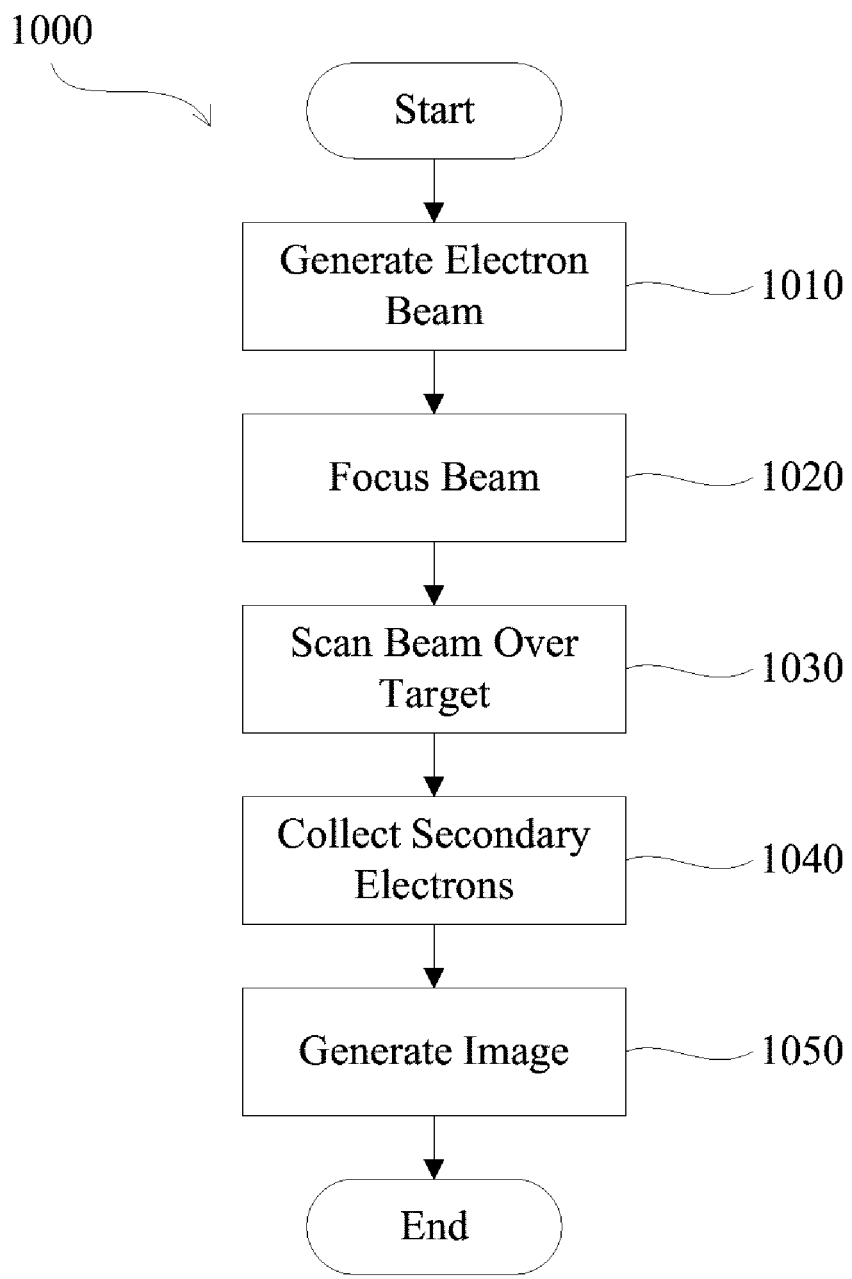
FIG. 13 is a flowchart illustrating a method of using an electron beam column, incorporating the stacked component, for imaging.

FIG. 13 is a flowchart illustrating a method 1000 of using an electron beam column package 120 incorporating a stacked component, such as the lens stack 600. First an electron beam is generated (1010). The beam is then focused (1020) using focusing components, e.g., the lens stack 600, coupled to the beam column package 120. The beam is then scanned (1030) over a target, also using components, e.g., a dual octupole, in the column package 120. The scanned beam impacts the target, generating backscattered and secondary electrons (and/or x-rays), which are collected (1040) by a detector. An imaging device then generates (1050) an image based on the collected electrons. The method 1000 then ends. When the target includes a wafer, the scanning (1030) can cause the imprinting of a pattern for a circuit onto the wafer.

The foregoing description of the illustrated embodiments of the present invention is by way of example only, and other variations and modifications of the above-described embodiments and methods are possible in light of the foregoing teaching. For example, while the above embodiments describe using the packages for electrons, charged particles (ions) of any type could be used in place of or in addition to electrons. Further, connections may be wired, wireless, modem, etc. The embodiments described herein are not intended to be exhaustive or limiting. The present invention is limited only by the following claims.

What is claimed is:

1. An electron beam column lens stack, comprising:
two conductive layers; and
an insulator layer between the two conductive layers;
wherein the conductive layers and the insulator layer form a recess that increases the breakdown path.

2. The lens stack of claim 1, wherein the recess is at a sidewall of the lens stack.

3. The lens stack of claim 1, wherein the conductive layers and the insulator layer form a plurality of recesses at sidewalls of the lens stack.

4. The lens stack of claim 3, wherein a first recess in one of the conductive and insulator layers is perpendicular to a second recess in another layer.

5. The lens stack of claim 3, wherein the conductive layers are recessed with respect to the insulator layer at each conductor layer edge.

6. The lens stack of claim 1, wherein the conductive layers and the insulator layer form apertures and recesses within the conductive and insulator layers.

7. The lens stack of claim 1, wherein the conductive layers and the insulator layer form apertures within the layers and further form serrations extending outwards from the apertures.

8. The lens stack of claim 1, wherein the conductive layers form cutouts therein and the insulator layer is shaped to form an aperture therein, wherein one of the conductive layers has an air-bridge that spans one of the cutouts and is suspended over the aperture.

9. The lens stack of claim 1, wherein the conductive layers form cutouts therein that increase surface breakdown.

10. The lens stack of claim 1, each conductive layer having isolated conductive regions, the regions formed by recessed and trenches located at edges of the conductive layers.

11. The lens stack of claim 10, wherein the layers form apertures and vias therein and wherein the vias or the apertures are increasingly smaller from top to bottom.

12. A scanning electron microscope incorporating the lens stack of claim 1.

13. A lithography tool incorporating the lens stack of claim 1.

14. An analysis tool incorporating the lens stack of claim 1.

15. An inspection tool incorporating the lens stack of claim 1.

16. A method, comprising:
generating an electron beam;
focusing the beam with an electron beam column incorporating a lens stack, the lens stack having two conductive layers and an insulator layer between the two conductive layers, wherein the conductive layers and the insulator layer form a recess that increases the breakdown path; and
scanning the beam over a target.

17. The method of claim 16, wherein the recess is at a sidewall of the lens stack.

18. The method of claim 16, wherein the conductive layers and the insulator layer form a plurality of recesses at sidewalls of the lens stack.

19. The method of claim 18, wherein a first recess in one of the conductive and insulator layers is perpendicular to a second recess in another layer.

20. The method of claim 18, wherein the conductive layers are recessed with respect to the insulator layer at each conductor layer edge.

21. The method of claim 16, wherein the conductive layers and the insulator layer form apertures and recesses within the conductive and insulator layers.

22. The method of claim 16, wherein the conductive layers and the insulator layer form apertures within the layers and further form serrations extending outwards from the apertures.

23. The method of claim 16, further comprising:
collecting electrons or photons from the target; and
generating an image based on the collected electrons or photons.

24. The method of claim 16, wherein the target is a wafer and wherein the scanning imprints a pattern onto the wafer for a circuit.

25. The method of claim 16, wherein the conductive layers form cutouts therein and the insulator layer is shaped to form an aperture therein, wherein one of the conductive layers has an air-bridge that spans one of the cutouts and is suspended over the aperture.

26. The method of claim 16, wherein the conductive layers form cutouts therein that increase surface breakdown.

27. The method of claim 16, each conductive layer having isolated conductive regions, the regions formed by recessed and trenches located at edges of the conductive layers.

28. The method of claim 16, wherein the layers form apertures and vias therein and wherein the vias or the apertures are increasingly smaller from top to bottom.

29. A electron beam column lens stack, comprising:
two conductive layers; and
an insulator layer between the two conductive layers;
wherein the conductive layers and the insulator layer form at least one aperture within the layers and form serrations, which increase the surface breakdown path and extend outward from the at least one aperture.

* * * * *